(12) United States Patent
Liao et al.

(10) Patent No.: US 11,309,626 B2
(45) Date of Patent: Apr. 19, 2022

(54) WIRELESS COMMUNICATION DEVICE

(71) Applicant: AZUREWAVE TECHNOLOGIES, INC., New Taipei (TW)

(72) Inventors: Chih-Hao Liao, Taipei (TW); Hsin-Yeh Huang, Taipei (TW); Shu-Han Wu, Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 105 days.

(21) Appl. No.: 17/016,377

(22) Filed: Sep. 10, 2020

(65) Prior Publication Data

US 2021/0399413 A1 Dec. 23, 2021

(30) Foreign Application Priority Data

Jun. 17, 2020 (TW) ................ 109120391

(51) Int. Cl.
| | |
|---|---|
| *H05K 9/00* | (2006.01) |
| *H01Q 1/38* | (2006.01) |
| *H01Q 1/00* | (2006.01) |
| *H01Q 1/02* | (2006.01) |
| *H01Q 1/22* | (2006.01) |
| *H05K 1/02* | (2006.01) |

(52) U.S. Cl.
CPC ............ *H01Q 1/38* (2013.01); *H01Q 1/002* (2013.01); *H01Q 1/02* (2013.01); *H01Q 1/2283* (2013.01); *H05K 1/0218* (2013.01); *H05K 9/0026* (2013.01); *H05K 9/0084* (2013.01)

(58) Field of Classification Search
CPC ............ H05K 9/0026; H05K 9/0084
See application file for complete search history.

(56) References Cited

U.S. PATENT DOCUMENTS

| | | | | |
|---|---|---|---|---|
| 2012/0140423 | A1 | 6/2012 | Fisher, Jr. et al. | |
| 2013/0322040 | A1* | 12/2013 | Watanabe | H05K 9/0009 361/760 |
| 2014/0301043 | A1* | 10/2014 | Onishi | H05K 9/006 361/728 |
| 2014/0321097 | A1* | 10/2014 | McLean | H05K 3/30 361/818 |

(Continued)

FOREIGN PATENT DOCUMENTS

JP         2004215218 A      7/2004

*Primary Examiner* — Hung V Ngo

(74) *Attorney, Agent, or Firm* — Li & Cai Intellectual Property Office

(57) ABSTRACT

A wireless communication device is provided and includes a communication module, a dust and moisture resistant adhesive, and a nano-metallic layer. The communication module includes a circuit board, a communication chip and a plurality of passive components mounted on a carrying surface of the circuit board, and an insulating sheet that is disposed on the passive components and that has a thickness smaller than or equal to 150 μm. The dust and moisture resistant adhesive covers any electrically conductive portions of the communication module on the carrying surface. The nano-metallic layer covers the dust and moisture resistant adhesive, the communication chip, the passive components, and the insulating sheet, and is electrically coupled to a grounding portion of the circuit board. The wireless communication device does not include any grounding metal housing mounted on the circuit board.

10 Claims, 8 Drawing Sheets

(56) References Cited

U.S. PATENT DOCUMENTS

| | | | |
|---|---|---|---|
| 2015/0282387 A1* | 10/2015 | Yoo | H05K 9/0026 |
| | | | 361/700 |
| 2015/0282394 A1* | 10/2015 | Yumi | H05K 9/0088 |
| | | | 174/377 |
| 2016/0095249 A1* | 3/2016 | Kim | H05K 9/0026 |
| | | | 361/707 |
| 2018/0139872 A1* | 5/2018 | Song | H05K 9/0043 |
| 2018/0168029 A1* | 6/2018 | Kuk | H05K 3/284 |
| 2018/0235075 A1 | 8/2018 | Gaines et al. | |
| 2019/0008079 A1* | 1/2019 | Kondo | H05K 9/0026 |
| 2020/0008327 A1* | 1/2020 | Lear | H05K 9/0071 |
| 2020/0303320 A1* | 9/2020 | Kong | H05K 9/0026 |

\* cited by examiner

WIRELESS COMMUNICATION DEVICE

CROSS-REFERENCE TO RELATED PATENT APPLICATION

This application claims the benefit of priority to Taiwan Patent Application No. 109120391, filed on Jun. 17, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a communication device, and more particularly to a wireless communication device provided without any grounding metal housing.

BACKGROUND OF THE DISCLOSURE

A conventional wireless communication device includes a board, a communication chip mounted on the board, and a grounding metal housing that is fixed to the board and that is arranged outside of the communication chip. However, skilled persons in this technical field have become accustomed to the configuration of the conventional wireless communication device (e.g., the grounding metal housing is installed), so that the improvement of the conventional wireless communication device is easily neglected due to the above technical prejudice.

SUMMARY OF THE DISCLOSURE

In response to the above-referenced technical inadequacies, the present disclosure provides a wireless communication device to effectively improve on the issues associated with conventional wireless communication devices.

In one aspect, the present disclosure provides a wireless communication device, which includes a communication module, a dust and moisture resistant adhesive, and a nano-metallic layer. The communication module includes a circuit board, a communication chip, a plurality of passive components, and an insulating sheet. The circuit board has a carrying surface and a back surface that is opposite to the carrying surface. The circuit board includes a grounding portion. The communication chip is mounted on the carrying surface of the circuit board. The passive components are mounted on the carrying surface of the circuit board. The insulating sheet is disposed on the passive components and has a thickness that is greater than or equal to 150 μm. The passive components are arranged in a projection space defined by orthogonally projecting the insulating sheet toward the carrying surface. The dust and moisture resistant adhesive covers and is connected to any electrically conductive portions of the communication module on the carrying surface. The nano-metallic layer covers and is connected to the dust and moisture resistant adhesive, the communication chip, the passive components, and the insulating sheet. The nano-metallic layer is electrically coupled to the grounding portion. The wireless communication device excludes any grounding metal housing that is mounted on the circuit board and that is arranged outside of the nano-metallic layer.

In certain embodiments, the insulating sheet has a tracking surface that is arranged away from the circuit board and that is covered by the nano-metallic layer, and the tracking surface is configured to show information related to the passive components.

In another aspect, the present disclosure provides a wireless communication device, which includes a communication module, a dust and moisture resistant adhesive, and a nano-metallic layer. The communication module includes a circuit board, a communication chip, a plurality of passive components, and an insulating sheet. The circuit board has a carrying surface and a back surface that is opposite to the carrying surface. The circuit board includes a grounding portion. The communication chip is mounted on the carrying surface of the circuit board. The passive components are mounted on the carrying surface of the circuit board. The insulating sheet is disposed on the communication chip and the passive components and has a thickness that is greater than or equal to 150 μm. The communication chip and the passive components are arranged in a projection space defined by orthogonally projecting the insulating sheet toward the carrying surface. The dust and moisture resistant adhesive covers and is connected to any electrically conductive portions of the communication module on the carrying surface. The nano-metallic layer covers and is connected to the dust and moisture resistant adhesive, the communication chip, the passive components, and the insulating sheet. The nano-metallic layer is electrically coupled to the grounding portion. The wireless communication device does not include any grounding metal housing that is mounted on the circuit board and that is arranged outside of the nano-metallic layer.

Therefore, the wireless communication device of the present disclosure uses the insulating sheet having a specific thickness (e.g., the thickness can be at least 150 μm) to separate the passive components from the nano-metallic layer, so that the grounding metal housing of the conventional wireless communication device can be replaced by the nano-metallic layer. Moreover, the wireless communication device in the present disclosure does not include any grounding metal housing that is mounted on the circuit board and that is arranged outside of the nano-metallic layer, thereby effectively reducing the thickness of the wireless communication device.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
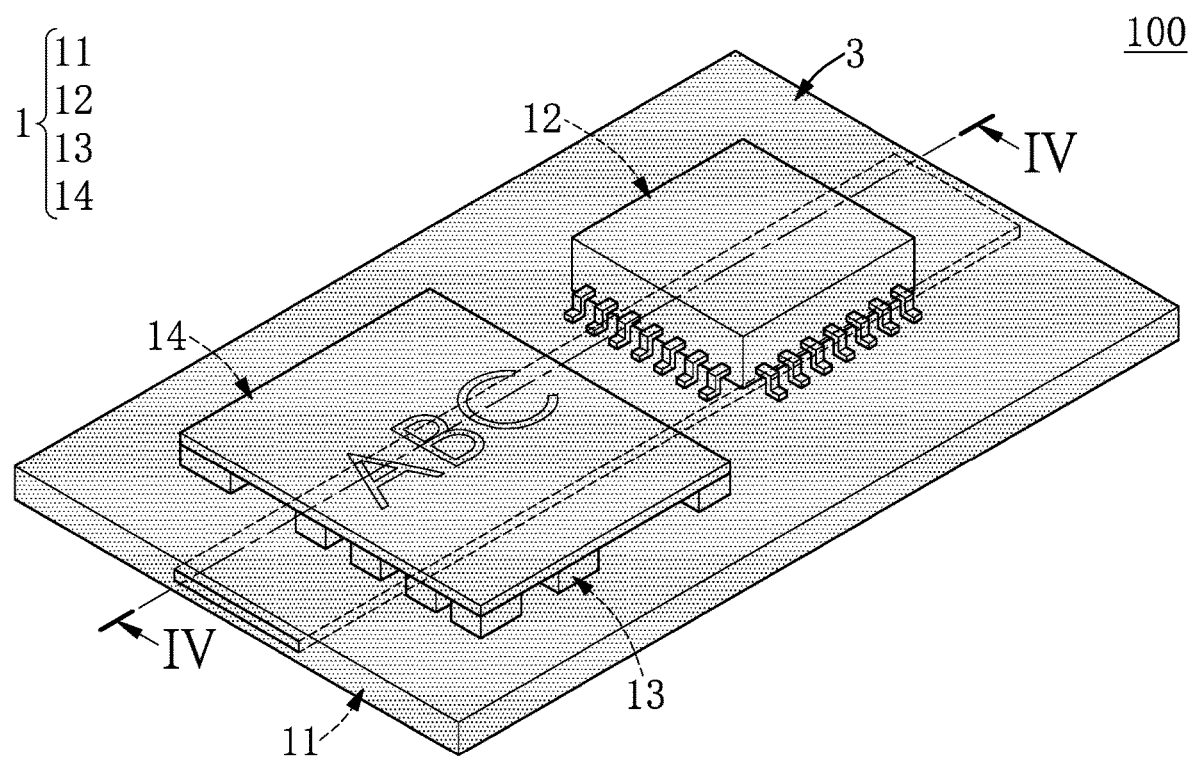
FIG. 1 is a perspective view of a wireless communication device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
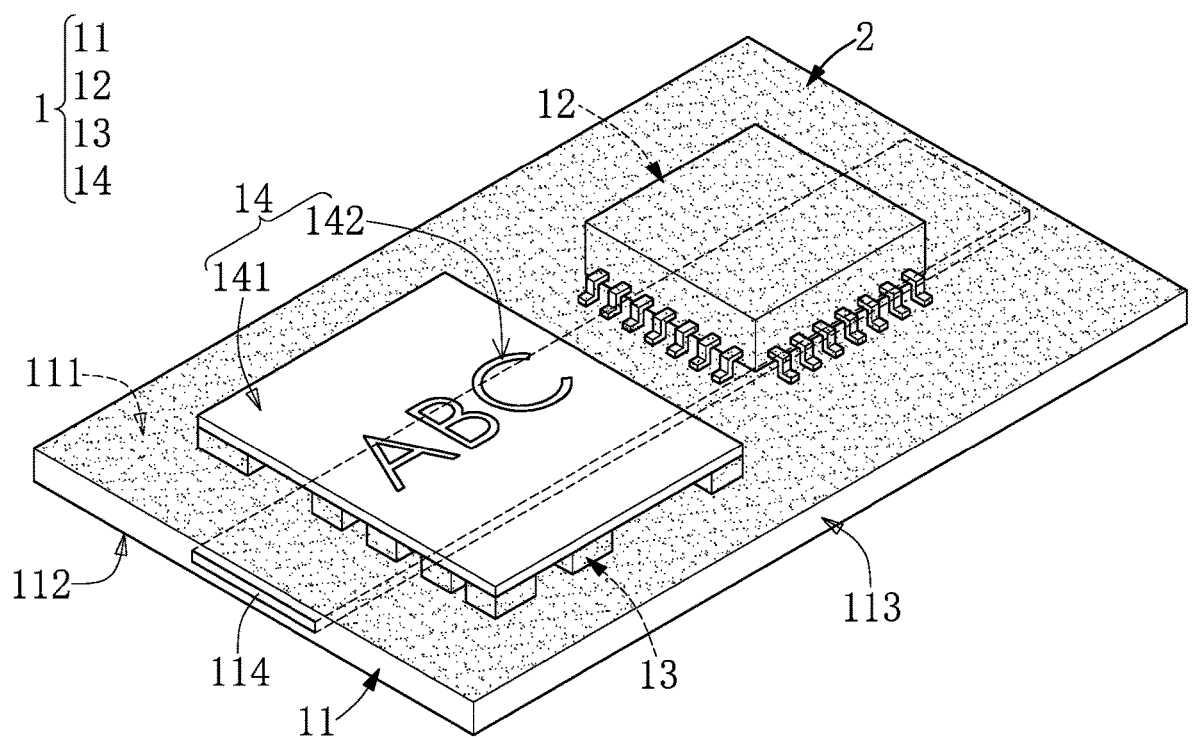
FIG. 2 is a perspective view showing the wireless communication device of FIG. 1 with a nano-metallic layer being omitted.
Figure 3:
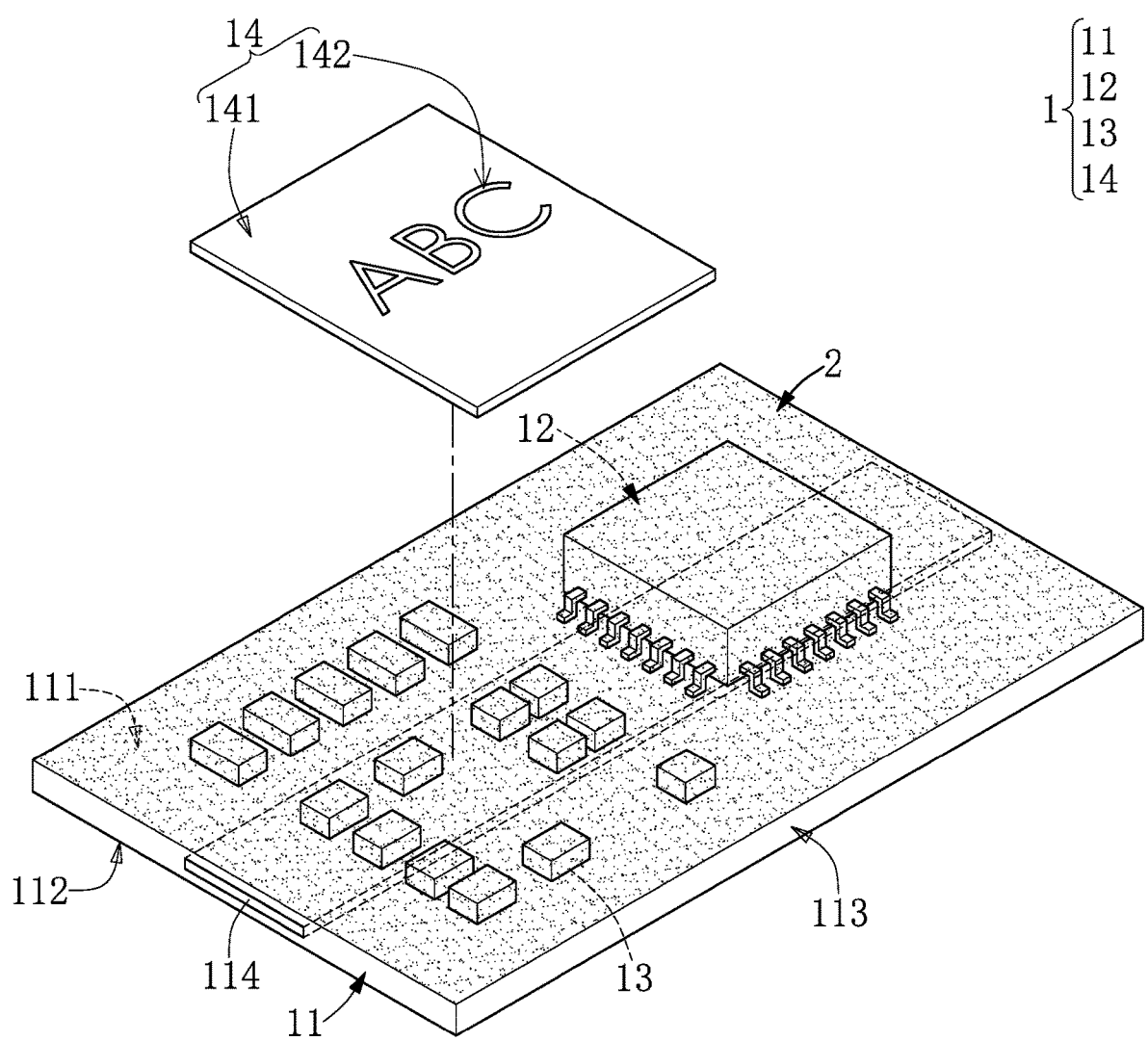
FIG. 3 is an exploded view of FIG. 2.
Figure 4:
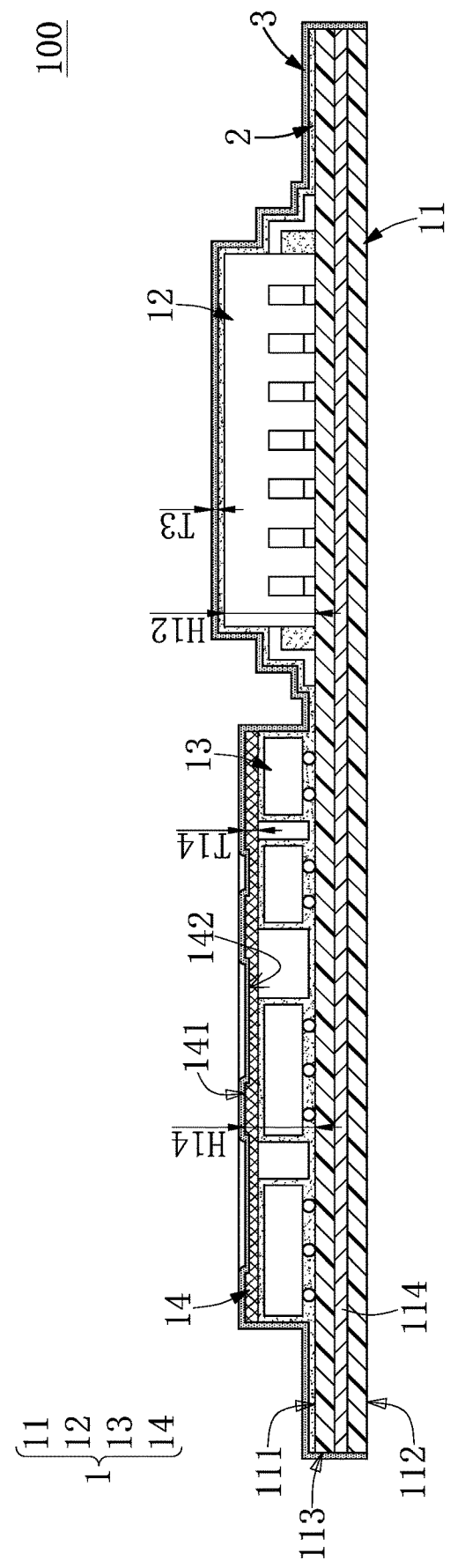
FIG. 4 is a cross-sectional view taken along line IV-IV of FIG. 1.

Referring to FIG. 1 to FIG. 4, a first embodiment of the present disclosure provides a wireless communication device 100 that can be a Wi-Fi module or a Bluetooth module, but the present disclosure is not limited thereto. In the present embodiment, the wireless communication device 100 includes a communication module 1, a dust and moisture resistant adhesive 2 formed on the communication module 1, and a nano-metallic layer 3 that is formed on the communication module 1 and the dust and moisture resistant adhesive 2. However, in other embodiments of the present disclosure, the wireless communication device 100 can further include an electrical connector mounted on the communication module 1.

The communication module 1 includes a circuit board 11, a communication chip 12 and a plurality of passive components 13 which are mounted on the same side of the circuit board 11, and an insulating sheet 14 that is disposed on the passive components 13. The communication module 1 in the present embodiment includes the above components, but the present disclosure is not limited thereto. For example, in other embodiments of the present disclosure, the communication module 1 can include other chips different from the communication chip 12. The following description describes the structure and connection relationship of each component of the communication module 1.

The circuit board 11 in the present embodiment is a printed circuit board (PCB), and an outer surface of the circuit board 11 has a carrying surface 111, a back surface 112 opposite to the carrying surface 111, and a surrounding lateral surface 113 that is connected to the carrying surface 111 and the back surface 112. The circuit board 11 includes a grounding portion 114. The grounding portion 114 in the present embodiment is a grounding layer embedded in the circuit board 11, and an end of the grounding layer is arranged on the surrounding lateral surface 113, but the present disclosure is not limited thereto.

Specifically, the circuit board 11 has a plurality of circuits (not shown in figures) formed on the carrying surface 111. In other words, the carrying surface 111 can be a whole top surface of the circuit board 11 or can be a portion of the top surface of the circuit board 11 having the circuits, but the present disclosure is not limited thereto. Moreover, the circuit board 11 can have a plurality of metal pads formed on the back surface 112 for being connected to an electronic component (not shown in figures), so that the wireless communication device 100 can be electrically coupled to the electronic component, but the present disclosure is not limited thereto.

The communication chip 12 and the passive components 13 are mounted on the carrying surface 111 of the circuit board 11 (e.g., the circuits). The communication chip 12 can be electrically coupled to at least one of the passive components 13 through the circuit board 11, and the passive components 13 are arranged adjacent to each other and are spaced apart from the communication chip 12, but the present disclosure is not limited thereto. For example, in other embodiments of the present disclosure, the passive components 13 can be in a ring-shaped arrangement to surround an outer side of the communication chip 12.

The insulating sheet 14 in the present embodiment is disposed only on the passive components 13, and the insulating sheet 14 can be fixed onto the passive components 13 through an adhesive, but the present disclosure is not limited thereto. The passive components 13 are arranged in a projection space defined by orthogonally projecting the insulating sheet 14 toward the carrying surface 111.

Specifically, a thickness T14 of the insulating sheet 14 is greater than or equal to 150 μm, and is preferably within a range of 200-300 μm. In the present embodiment, the insulating sheet 14 can be a glass fiber insulating sheet, a bakelite insulating sheet, or a ceramic insulating sheet, but the present disclosure is not limited thereto.

Moreover, a height H14 of the insulating sheet 14 with respect to the carrying surface 111 is smaller than or equal to a height H12 of the communication chip 12 with respect to the carrying surface 111. The shape of the insulating sheet 14 can correspond to a contour defined by the passive components 13. However, in other embodiments of the present disclosure, the insulating sheet 14 and the communication chip 12 can complement each other in shape.

The dust and moisture resistant adhesive 2 covers and is connected to any electrically conductive portions (e.g., the circuits of the circuit board 11, contacts of the communication chip 12, and contacts of the passive components 13) of the communication module 1 on the carrying surface 111, thereby ensuring that the electrically conductive portions of the communication module 1 on the carrying surface 111 do not short circuit each other.

It should be noted that the dust and moisture resistant adhesive 2 in the present embodiment is provided to cover the electrically conductive portions of the communication module 1 on the carrying surface 111, but the dust and moisture resistant adhesive 2 can further extend to cover non-conductive portions of the communication module 1 (e.g., all components of the communication module 1 on the carrying surface 111).

The nano-metallic layer 3 covers and is connected to the dust and moisture resistant adhesive 2, the communication chip 12, the passive components 13, and the insulating sheet 14. In the present embodiment, the dust and moisture resistant adhesive 2 and a side portion of the communication module 1 (e.g., all components of the communication module 1 on the carrying surface 111) opposite to the back surface 112 are entirely covered by the nano-metallic layer 3, so that the dust and moisture resistant adhesive 2 and the side portion of the communication module 1 (e.g., all components of the communication module 1 on the carrying surface 111) are completely isolated from an external environment through the nano-metallic layer 3.

Moreover, the nano-metallic layer 3 is electrically coupled to the grounding portion 114, thereby establishing an electromagnetic shielding effect. Specifically, the nano-metallic layer 3 in the present embodiment is connected to the grounding layer (i.e., the grounding portion 114) by covering the surrounding lateral surface 113, so that the configuration of the wireless communication device 100 can be easily manufactured, but the present disclosure is not limited thereto.

Specifically, the nano-metallic layer 3 in the present embodiment is a nano-silver layer having a thickness T3 within a range of 3-5 μm. The nano-metallic layer 3 is preferably formed on the dust and moisture resistant adhesive 2 and the communication module 1 in an ultrasonic spraying manner, so that the nano-metallic layer 3 can cover any position of the dust and moisture resistant adhesive 2 and the communication module 1. In other words, the nano-metallic layer 3 in the present embodiment is not formed in an electro-plating manner.

In the present embodiment, the wireless communication device 100 uses the insulating sheet 14 having a specific thickness to separate the passive components 13 from the nano-metallic layer 3, so that the grounding metal housing of the conventional wireless communication device can be replaced by the nano-metallic layer 3. Moreover, the wireless communication device 100 in the present embodiment does not include any grounding metal housing that is mounted on the circuit board 11 and that is arranged outside of the nano-metallic layer 3, thereby effectively reducing the thickness of the wireless communication device 100. In other words, any wireless communication device having a grounding metal housing is different from the wireless communication device 100 of the present embodiment.

In addition, the insulating sheet 14 is not only used to enable the nano-metallic layer 3 to replace the grounding metal housing of the conventional wireless communication device, but also configured to show information (e.g., test information) related to the passive components 13.

Specifically, the insulating sheet 14 has a tracking surface 141 that is arranged away from the circuit board 11 and that is covered by (or is filled with) the nano-metallic layer 3, and the tracking surface 141 is configured to show the information related to the passive components 13. It should be noted that the insulating sheet 14 of the present embodiment cannot be printed to form any information.

In the present embodiment, the insulating sheet 14 has at least one identification slot 142 recessed in the tracking surface 141, inner surfaces of the at least one identification slot 142 are covered by the nano-metallic layer 3, and the at least one identification slot 142 is configured to show the information related to the passive components 13, but the present disclosure is not limited thereto. For example, in other embodiments of the present disclosure, the insulating sheet 14 can have at least one protrusion on the tracking surface 141 for showing the information related to the passive components 13.

Moreover, the components (e.g., the communication chip 12, the passive components 13, and the insulating sheet 14) of the wireless communication device 100 in the present embodiment are provided on the carrying surface 111 of the circuit board 11, but the present disclosure is not limited thereto. For example, in other embodiments of the present disclosure, the back surface 112 of the circuit board 11 can be formed to have structures similar to the components provided on the carrying surface 111.

Second Embodiment

Figure 5:
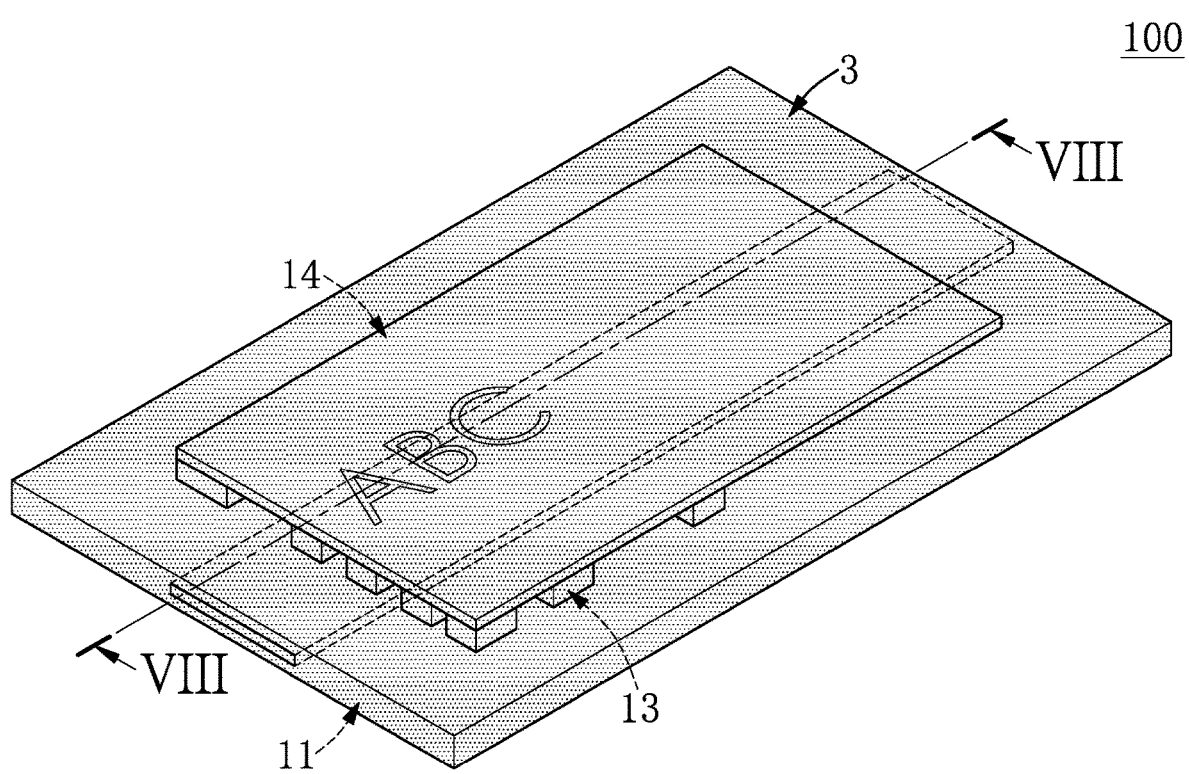
FIG. 5 is a perspective view of a wireless communication device according to a second embodiment of the present disclosure.
Figure 6:
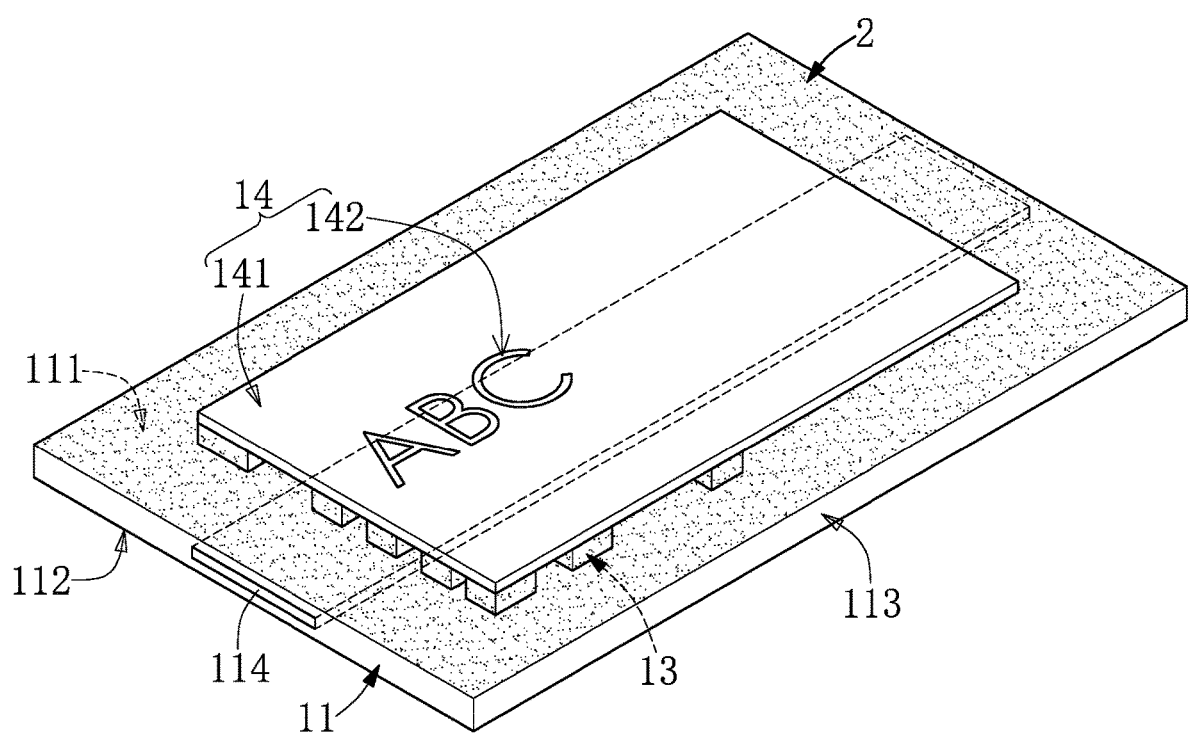
FIG. 6 is a perspective view showing the wireless communication device of FIG. 5 with a nano-metallic layer being omitted.
Figure 7:
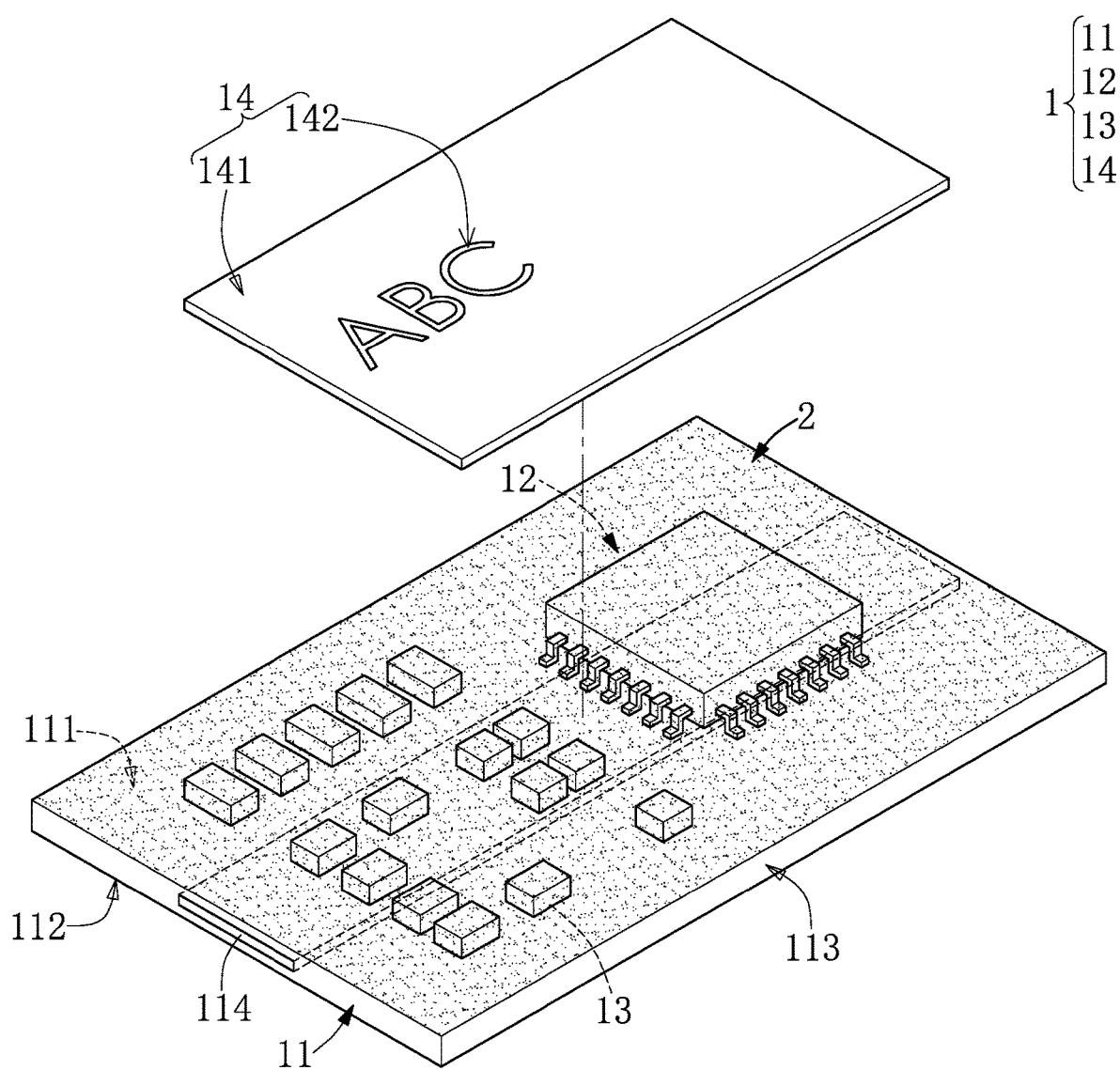
FIG. 7 is an exploded view of FIG. 6.
Figure 8:
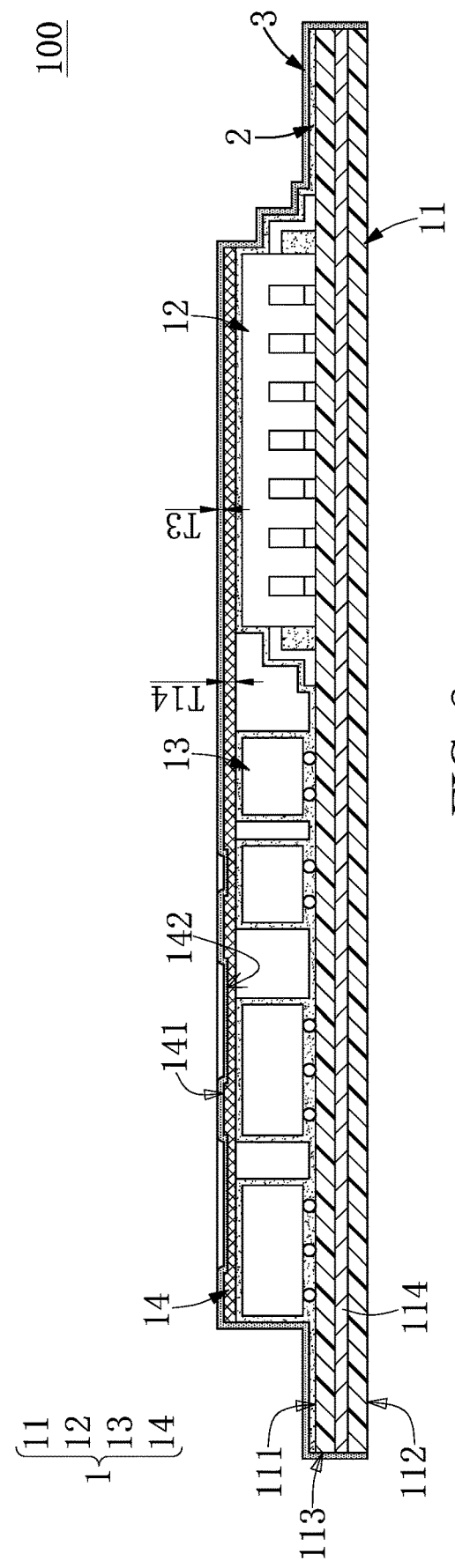
FIG. 8 is a cross-sectional view taken along line VIII-VIII of FIG. 5.

Referring to FIG. 5 to FIG. 8, a second embodiment of the present disclosure similar to the first embodiment of the present disclosure is presented. For the sake of brevity, descriptions of the same components in the first and second embodiments of the present disclosure will be omitted herein, and the following description only discloses different features between the first and second embodiments. The different features reside in the connection relationship between the insulating sheet 14 and other components (e.g., the circuit board 11, the communication chip 12, and the passive components 13).

In the present embodiment, the insulating sheet 14 in the present embodiment is disposed on the communication chip 12 and the passive components 13, and the insulating sheet 14 can be fixed onto the communication chip 12 and the passive components 13 through an adhesive, but the present disclosure is not limited thereto. The communication chip 12 and the passive components 13 are arranged in a projection space defined by orthogonally projecting the insulating sheet 14 toward the carrying surface 111. Specifically, a projection region defined by orthogonally projecting the insulating sheet 14 onto the carrying surface 111 is at least 70% of an area of the carrying surface 111.

In conclusion, the wireless communication device 100 of the present disclosure uses the insulating sheet 14 having a specific thickness (e.g., the thickness can be at least 150 μm or within a range of 200-300 μm) to separate the passive components 13 from the nano-metallic layer 3, so that the grounding metal housing of the conventional wireless communication device can be replaced by the nano-metallic layer 3. Moreover, the wireless communication device 100 in the present embodiment does not include any grounding metal housing that is mounted on the circuit board 11 and that is arranged outside of the nano-metallic layer 3, thereby effectively reducing the thickness of the wireless communication device 100.

In addition, the insulating sheet 14 of the present embodiment is not only used to enable the nano-metallic layer 3 to replace the grounding metal housing of the conventional wireless communication device, but also configured to show information (e.g., test information) related to the passive components 13. For example, the insulating sheet 14 can have a plurality of identification slots 142 recessed in the tracking surface 141 for showing the information related to the passive components 13.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wireless communication device, comprising:
    a communication module including:
        a circuit board having a carrying surface and a back surface that is opposite to the carrying surface, wherein the circuit board includes a grounding portion;
        a communication chip mounted on the carrying surface of the circuit board;
        a plurality of passive components mounted on the carrying surface of the circuit board; and
        an insulating sheet disposed on the passive components and having a thickness that is greater than or equal to 150 µm, wherein the passive components are arranged in a projection space defined by orthogonally projecting the insulating sheet toward the carrying surface;
    a dust and moisture resistant adhesive covering and connected to any electrically conductive portions of the communication module on the carrying surface; and
    a nano-metallic layer covering and connected to the dust and moisture resistant adhesive, the communication chip, the passive components, and the insulating sheet, wherein the nano-metallic layer is electrically coupled to the grounding portion,
    wherein the wireless communication device does not include any grounding metal housing that is mounted on the circuit board and that is arranged outside of the nano-metallic layer.

2. The wireless communication device according to claim 1, wherein the insulating sheet has a tracking surface that is arranged away from the circuit board and that is covered by the nano-metallic layer, and the tracking surface is configured to show information related to the passive components.

3. The wireless communication device according to claim 2, wherein the insulating sheet has at least one identification slot recessed in the tracking surface, inner surfaces of the at least one identification slot are covered by the nano-metallic layer, and the at least one identification slot is configured to show the information related to the passive components.

4. The wireless communication device according to claim 1, wherein the thickness of the insulating sheet is within a range of 200-300 µm, and the insulating sheet is a glass fiber insulating sheet, a bakelite insulating sheet, or a ceramic insulating sheet.

5. The wireless communication device according to claim 1, wherein a height of the insulating sheet with respect to the carrying surface is smaller than or equal to a height of the communication chip with respect to the carrying surface.

6. The wireless communication device according to claim 1, wherein a thickness of the nano-metallic layer is within a range of 3-5 µm, and the dust and moisture resistant adhesive and a side portion of the communication module opposite to the back surface are entirely covered by the nano-metallic layer, so that the dust and moisture resistant adhesive and the side portion of the communication module are completely isolated from an external environment through the nano-metallic layer.

7. The wireless communication device according to claim 1, wherein the circuit board has a surrounding lateral surface connected to the carrying surface and the back surface, the grounding portion is a grounding layer embedded in the circuit board, and an end of the grounding layer is arranged on the surrounding lateral surface, and wherein the nano-metallic layer is a nano-silver layer that is connected to the grounding layer by covering the surrounding lateral surface.

8. A wireless communication device, comprising:
    a communication module including:
        a circuit board having a carrying surface and a back surface that is opposite to the carrying surface, wherein the circuit board includes a grounding portion;
        a communication chip mounted on the carrying surface of the circuit board;
        a plurality of passive components mounted on the carrying surface of the circuit board; and
        an insulating sheet disposed on the communication chip and the passive components and having a thickness that is greater than or equal to 150 µm, wherein the communication chip and the passive components are arranged in a projection space defined by orthogonally projecting the insulating sheet toward the carrying surface;
    a dust and moisture resistant adhesive covering and connected to any electrically conductive portions of the communication module on the carrying surface; and
    a nano-metallic layer covering and connected to the dust and moisture resistant adhesive, the communication chip, the passive components, and the insulating sheet, wherein the nano-metallic layer is electrically coupled to the grounding portion,
    wherein the wireless communication device does not include any grounding metal housing that is mounted on the circuit board and that is arranged outside of the nano-metallic layer.

9. The wireless communication device according to claim 8, wherein a thickness of the nano-metallic layer is within a range of 3-5 µm, and the dust and moisture resistant adhesive and a side portion of the communication module opposite to the back surface are entirely covered by the nano-metallic layer, so that the dust and moisture resistant adhesive and the side portion of the communication module are completely isolated from an external environment through the nano-metallic layer.

10. The wireless communication device according to claim 9, wherein a projection region defined by orthogonally projecting the insulating sheet onto the carrying surface is at least 70% of an area of the carrying surface.

* * * * *